Figure 3:
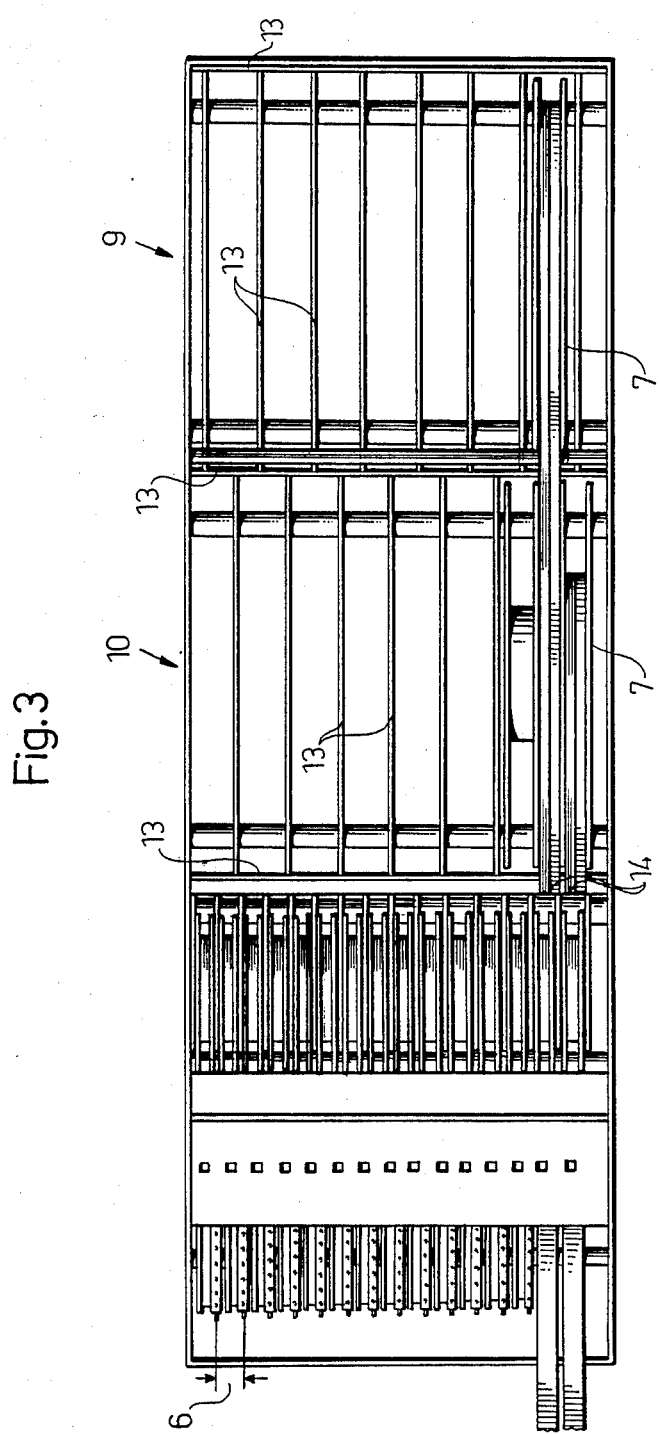

United States Patent [19]

Stridsberg et al.

[11] Patent Number: 4,670,976

[45] Date of Patent: Jun. 9, 1987

[54] CASSETTE MAGAZINE FOR A COMPONENT MOUNTING MACHINE

[75] Inventors: Lennart Stridsberg, Enskede; Gunnar Rodin, Bromma, both of Sweden

[73] Assignee: Mydata Automation AB, Stockholm, Sweden

[21] Appl. No.: 847,654

[22] PCT Filed: Jul. 9, 1985

[86] PCT No.: PCT/SE85/00277

§ 371 Date: Mar. 4, 1986

§ 102(e) Date: Mar. 4, 1986

[87] PCT Pub. No.: WO86/00778

PCT Pub. Date: Jan. 30, 1986

[30] Foreign Application Priority Data

Jul. 9, 1984 [SE] Sweden .............................. 8403625

[51] Int. Cl.$^4$ .............................................. H05K 3/30
[52] U.S. Cl. ........................................ 29/740; 29/759; 226/76; 226/156
[58] Field of Search ................. 29/740, 741, 739, 759; 226/76, 156, 157; 414/223, 225

[56] References Cited

U.S. PATENT DOCUMENTS 4,174,567 11/1979 Kamoshida et al. .............. 226/76 X
4,393,579 7/1983 Van Hooreweder ................. 29/740
4,610,083 9/1986 Campisi et al. .................... 29/740 X

*Primary Examiner*—Carl E. Hall
*Attorney, Agent, or Firm*—Burns, Doane, Swecker & Mathis

[57] ABSTRACT

A cassette magazine for a component mounting machine. This machine comprises a driving member (34) for a number of reels (7) which are insertable into the magazine and which carry components enclosed in a carrier tape (2) wound on each reel. The reels are arranged in standing position in one or more parallel rows (9,10) transversely to the feeding direction of the tape. The tapes are by means of driving members fed to a component expelling and picking station (23) in which means (24) are arranged to punch the components from the carrier tapes so that they will be accessible for a picking tool. The driving members comprise a number of feeding wheels (32) and drive segments (43) corresponding to the number of tapes, said wheels and said segments being arranged for individual feeding of each of the tapes. The feeding wheels are stationary with respect to the magazine whereas the drive segments are supported on a movable carriage (40) and can be brought into and out of engagement with the corresponding feeding wheel by means of electrical members (44). The carriage is displaceable in the transport direction of the carrier tape by an electric motor (35) between two end positions whereby the carriage movement is coordinated with energizing of the electrical members in such a way that a certain feeding wheel and the corresponding drive segment will be brought into engagement with one another for displacing the carriage from a first end position to a second end position and out of engagement with one another when returning the carriage from the second end position to the first one.

6 Claims, 5 Drawing Figures

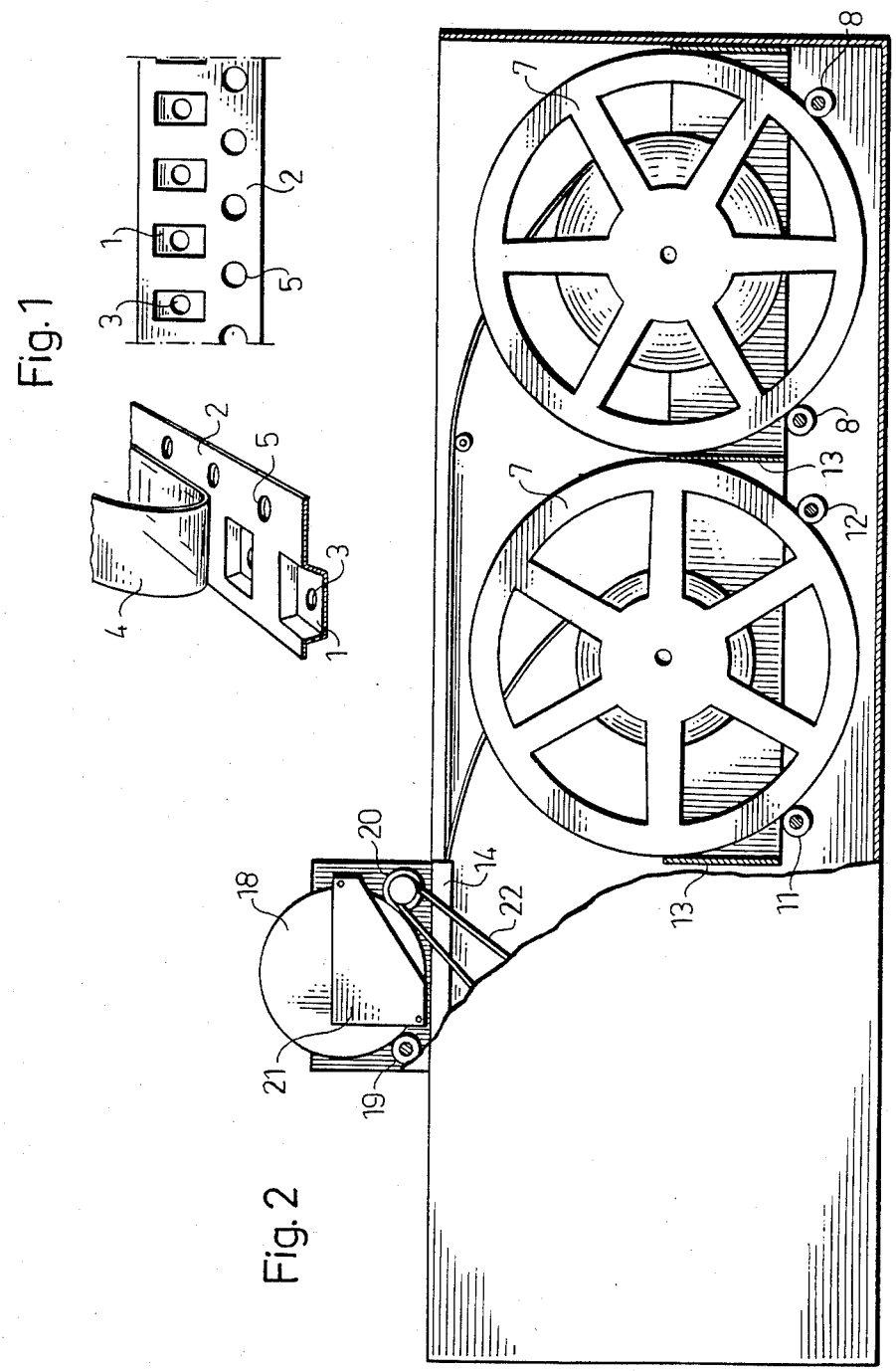

CASSETTE MAGAZINE FOR A COMPONENT MOUNTING MACHINE

The present invention relates to a cassette magazine for a component mounting machine for mounting chip-type electronic components on a substrate and where the components are delivered in reels of tape.

Surface mounted electronic components are small, for instance in the size of 2×1.25×0.5 millimeters and this gives rise to a number of practical consequences for the mounting operation. The components can only be mounted by hand with great difficulty which means, that there is a great demand for automatic mounting machines even at small production quantities.

Surface mounted components are often delivered in so-called blister tapes which have a width of 8, or in certain cases, 12 or 16 millimeters and are provided with a cavity for each component. By delivering the components in a reel they will also be easy to handle in distribution and in the factory. They will also be relatively easy to handle in the pick and place machine.

Instead of reels the components can be fed to the pick and mounting member of the machine by means of vibrators. Other magazines can be made in the form of pipes in which the components are stacked but reels and vibrators are predominant.

With the word component feeder is meant a device which feeds a component to a certain predecided picking point where it can be fetched by a picking head. The component feeders in today's machines therefore comprise a feeding device for blister tapes or a vibrator.

In existing mounting machines problems often arise due to the fact that the feeding of the components does not operate satisfactorily. The machines are therefore often provided with a so-called refire function which means, that the machine tries again if it does not get hold of the component at the first trial. After three trials the machine stops and calls for the operator. This will in fact occur often in many cases. Actually, many machines are said to operate with half or a quarter of the capacity they would have had if they had operated continuously. Every error in a component magazine will cause the machine to stop until the operator has succeeded in finding and remedying the error.

Another problem with the mounting machines used today is the demand to reload the magazine when a new type of circuit card is to be mounted. Since this type of card normally comprises other components the contents of the magazine often has to be changed. In order to keep the store costs low, many enterprises want to manufacture short series of certain card types, for instance of five or sometimes only one card which will drastically lower production capacity.

Figure 4:
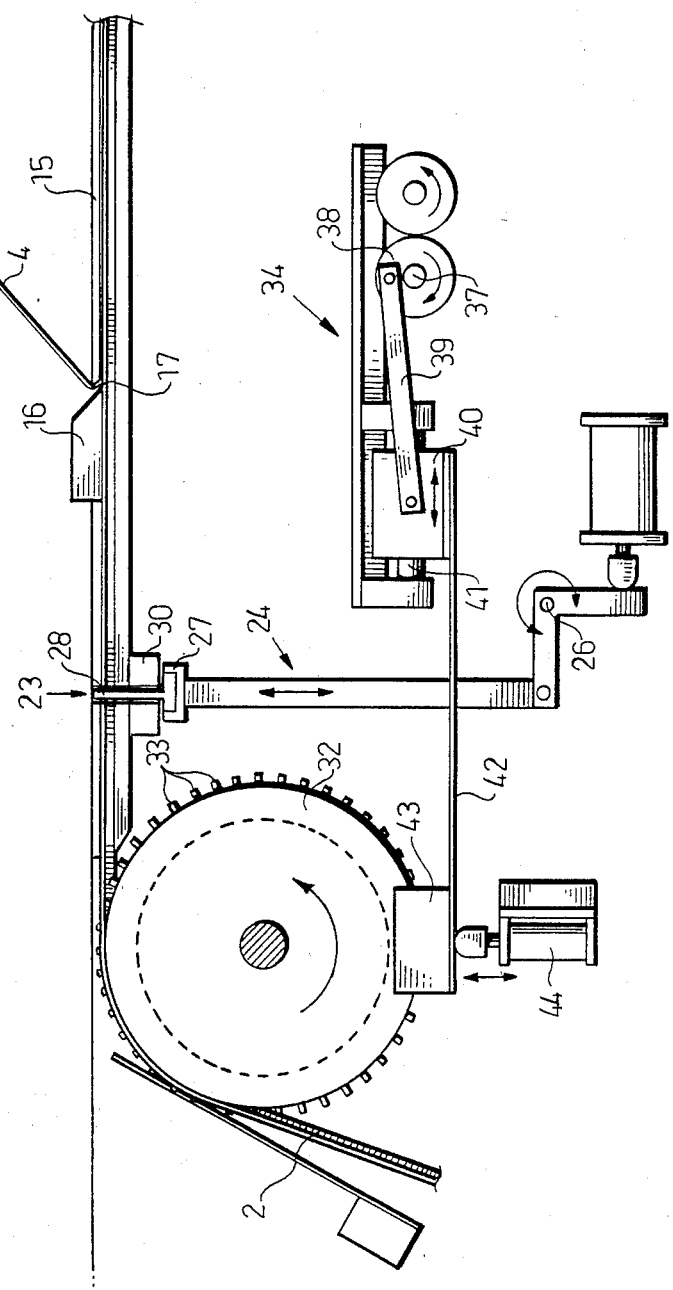
Figure 5:
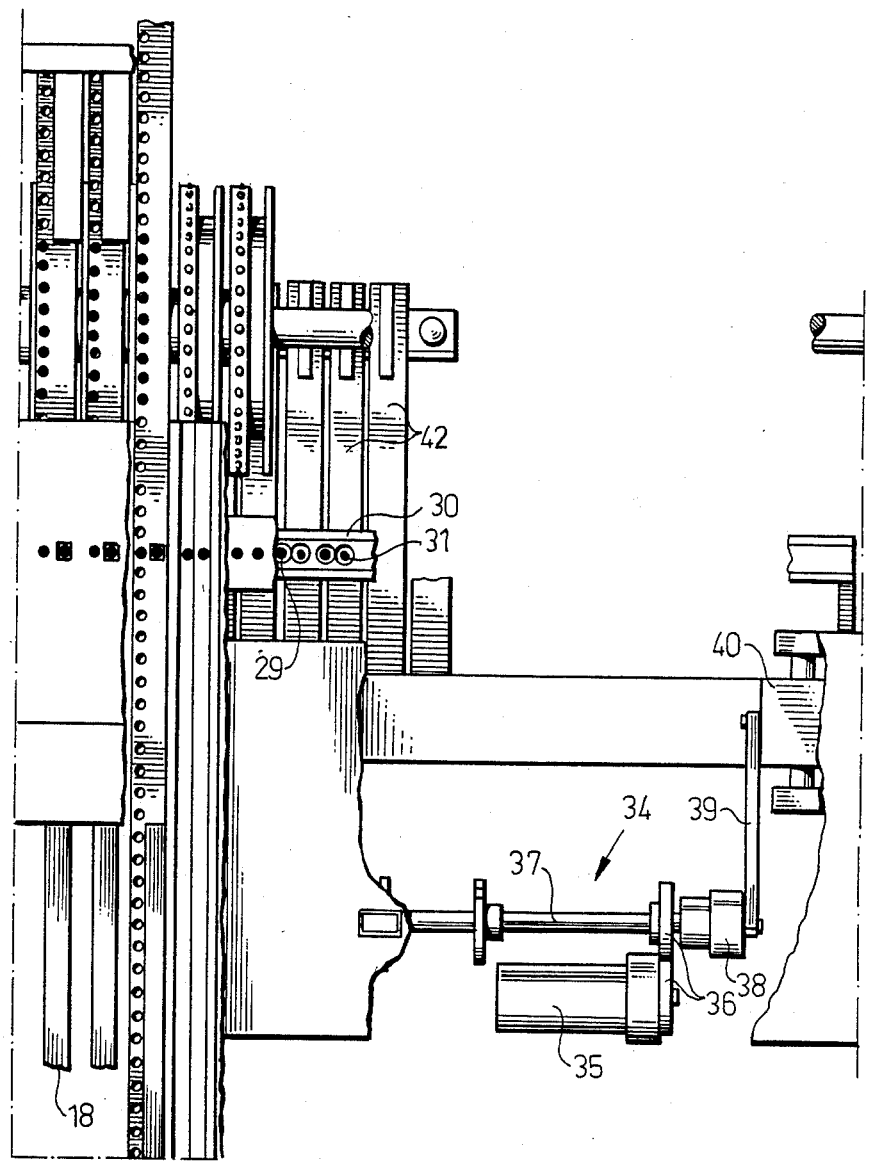

The problems mentioned above have been considerably reduced in a machine according to the invention as defined in the characterizing clause of the main claim. An embodiment of the invention will now be described by way of example with reference to the accompanying drawings in which FIG. 1a shows a perspective and FIG. 1b depicts a plan view of a blister tape, FIG. 2 is a sectional sideview of the cassette magazine of the machine according to the invention, FIG. 3 is a view from above of the machine according to FIG. 2, FIG. 4 is a sideview of the feeding and expelling mechanism of the machine according to the invention, and FIG. 5 is a partly cut-out view of the machine according to FIG. 4.

The problem of sudden stops due to operational disturbances in a component feeder can be considerably reduced by building together a number of the feeding means for cassettes and by designing the machine so that the cassettes can be exchanged while the machine is in operation.

When a fault is discovered in a feeding device the attention of the operator is called for by alarm in the usual way. However, the machine does not stop and wait for the operator but can continue to mount components taken from other cassettes. Normally, there are a number of components in the other cassettes which should be mounted on the same card. When the machine is occupied therewith the operator has time to take out the deficient cassette, correct the deficiency and reload the cassette. Since the machine is designed in such a way that this operation can be easily carried out the practical capacity can increase up to 90% of the theoretical value instead of the normal 25–50%. Some interruptions are difficult to avoid for instance to change mounted cards for unmounted ones. This will cause periods of rest if the machine is not provided with an automatic card changer which is rarely economically justified when it comes to smaller and cheaper machines.

In the machine according to the invention it is possible to perform these measures since the machine has 7–13 different cassette locations and can therefore find components to mount in another cassette since the cassettes stand still on a table and can therefore be taken out and inserted without stopping the machine. In most other machines the component feeders are disposed on movable carriages and rotating tables and they are therefore sometimes even dangerous to touch during operation.

The times to load the component feeders with new components when a new type of circuit card should be mounted are evaluated in three different ways in the machine according to the invention, all of which are related to the design of the component feeders with cassettes standing on a table.

The blister tape cassettes in the machine according to the invention are disposed with very short distance between each reel and this makes it possible for the machine to encompass a great number of reels, e.g. up to 208 reels. When the number of reels pass a certain limit there is a rapid decrease in the number of component types which have to be changed when a new card type should be mounted. A great number of circuit designs can be entirely based on passive components in the E12 series for resistances (10 12 15 18 22 27 33 38 47 56 68 82 etc) which means that 49 different reels cover all normally used values from 100 Ohm to 1 MOhm. In a similar way 49 reels in the E6 series (10 15 22 33 47 58 etc) cover the predominant number of capacities from 10 pF to 68 uF. If five usual diodes and transistors are added to this it is obvious that 96 reels can cover the entire standard assortment of two and three pole components. Already in an embodiment with 160 reels it will therefore be possible to mount the majority of card types without need for inserting more than 15–30 specific component types in the machine to be used for that type of card.

The cassette design according to the invention will considerably reduce the costs for each component feeder and this will make it economically justified to have extra cassettes which are loaded with the specific components demanded by the next type of card. When it then comes to change of cards it will be an operation of a few seconds to change those cassettes which contain the specific component types to be used for that type of card.

The central computer of the machine has so much free memory capacity that it can plan the production of the next type of cards simultaneously as it mounts the running type. It can therefore mount the last card of a certain type in such order that those cassettes in which separate reels should be changed are released in due succession. The machine can for instance at first mount all components from reels 4 and 7 in cassette 1 and then order the operator to pull out cassette 1 and change reels 4 and 7. When the operator is occupied with this the machine will mount on the first hand those components in cassette 2 which should be changed. When the operator has put cassette 1 back the machine will order him to change reels in cassette 2 and can during that time mount such component types from cassette 1 which are used on the new as well as the old type of cards.

As appears from the above a machine according to the invention with easily accessible and during operation exchangeable cassettes with high packing density can avoid many serious capacity problems which mar the present types of machines. To provide such a cassette a great number of problems have to be solved.

The different tapes which are to be handled in a machine can have different width but are all designed according to the same principle as appears from FIG. 1. The components are located in stamped cavities 1 in a tape 2 which is often made of plastic. In the bottom of each cavity there could be a hole 3 to permit a punch coming from below to push up the component. Normally the component is transported by means of a suction nozzle which is situated above the component. For very small components the underpressure is not always sufficient to detach the component if it has got stuck in a cavity. This could very well happen since the cavity due to the manufacturing methods often is slightly tapered which also appears from FIG. 1.

Up till the moment when the component is picked up it is sealingly retained in its cavity by a transparent protective layer 4. Before the component is taken out this layer must be removed.

The tape 2 is provided with transport holes 5 with a distance of 4.0 mm being the same for tapes of different width.

The principle for the cassette appears from FIGS. 2 and 3.

The module distance 6 is 10 mm. The total width of each cassette is 178 mm which means that they can be stacked with a distance of 180 mm for each cassette. This makes it possible to accommodate 16 reels of 8 mm with a range of 180 mm which gives a capacity utilization of 71% of that space. The machines hitherto used of the same size as the machine now described often have a centre to centre distance between the component feeders of about 32 mm which means three times less utilization of the space.

Each tape is located on a feed wheel 7 of a common standard type which is delivered together with the tape. The wheel is not located on a shaft but stands on two sliding rollers 8.

In order to reach the desired very high degree of compaction it will not be possible to position all wheels side by side. As appears from FIG. 3 the wheels are therefore positioned in two rows where one row 9 is displaced one module distance relative to the other row 10. The rollers in the second row 10 rest on the sliding rollers 11 and 12. To prevent the rollers from lateral displacement they are put down in compartments formed by the walls 13.

The tape is fed into a guiding rail 14. To make it possible to use the same magazine with different types and width of tapes the rail 14 has a width of 20 mm and could be changed to other versions with tracks for tapes with a width of 12 or 16 mm. On the rail 14 there is a common cover 15 as indicated on FIG. 4.

In the interspace between the lid 15 and the scraper beam 16 (see FIG. 4) the protective tape 4 is moved when it is pulled off over a sharp edge 17 against a winding reel 18 (see FIG. 2).

The reel 18 is neither located on a shaft but is supported on two rollers 19 and 20 which makes it easy for the operator to handle the reels. To prevent it from lateral displacement it is moreover supported by the side walls 21. The winding reel is given a certain guiding torque when the roller 20 rotates. The torque is supplied from a cogged band 22 which is driven by the motor which is in common for the cassettes by means of a cogged wheel (not shown). The motor is only operated when some of the tapes should be moved. To provide sufficient torque the winding reel is made of a heavy material such as for instance steel.

The carrier tape with components is transported to the picking point 23. In those cases when the carrier tape 2 so demands a punch device 24 could be activated. The punching means 24 is driven by two magnets 25 which via the shaft 26 are mechanically connected in parallel. It lifts a beam 27 which pushes up the centering pins 28 and shorter punching pins located therebehind and therefore not shown on the drawings. The centering pins are controlled by the holes 29 (see FIG. 5) in the guide rail 30 and will pass through the transport holes 5 in the tape 2 and thereby center the same. When the carrier tape 2 once is centered the punching pin will pass against the hole 3 in the bottom of the cavity in the carrier tape and punch up the components from the cavity. The punching pin is controlled by the holes 31.

The carrier tape then proceeds to the feeding wheel 32 which has a number of teeth 33 which mate with the transport holes on the tape. The tape 2 is supported by two external wheel segments and between them there is a cogged wheel which is driven by a feeding mechanism 34.

The feeding mechanism 34 is driven by a motor 35 which via a cogged wheel transmission 36 drives the shaft 37. This mechanism also drives the winding reel for the protective tape via the belt 22. Moreover, it guides two excenter discs 38 which through two connecting rods 39 drive the carriage 40. This carriage runs on two shafts 41. On the shaft there are also two discs with slots. Each of the discs passes through a corresponding opto fork. By means of this fork the control computer receives information when the carriage is in its forward or rear position.

The carriage 40 has a number of plate springs 42 which on their upper side are provided with rack segments 43. The plate springs are normally in a lower position but can be forced to an upper position by means of a magnet 44 corresponding to each spring. In that case the rack segment 43 will engage into a cogged wheel. The stroke of the carriage 40 is adapted in such a way that it will feed the cogged wheels exactly one tooth pitch means that the carrier tape will be fed one module (4 mm).

When the machine according to the embodiment should fetch a component from a tape the latter has to be advanced one module. Normally there are no components in position 23 where it can be fetched by the picking nozzles. The control system will then activate a relevant magnet 44 so that its cogged wheel segment engages with the cogged wheel for the tape in question. Then the motor 35 will be started. Since the carriage 40 is driven by an excenter disc it will start very smoothly. When the motor starts the excenter will be located in its left dead point.

When the motor has turned the shaft 37 one half turn the carriage will be in its right dead position and the tape will again have come to a standstill. The entire movement has been carried out very smoothly and without the jerking start or stop courses which characterize toothed wheels driven by magnets or pressurized air. Despite thereof the excenter can transmit considerable forces to feed the tape. The control computer will be informed that the carriage has reached its left end position by means of one of the opto forks and will then let the magnet 44 free. Since there is no longer any torque between the cogged wheel and the rack the blade spring 42 will return back to its lower position.

The motor will continue to operate until the carriage has reached its right dead position which will indicated by the second opto fork. Then the motor is braked.

During the whole time when the motor has been operated the reel 20 is driven and it will pull the winding reel 18 winding up the protective layer 4 from the tape 2 which is fed.

The component can now be fetched when the machine brings down the picking nozzle against the component which is now located at the picking point 23. If the tape has discharge holes 3 the punch device 24 will be activated which leads to the component being punched up against the picking nozzle by means of the punching pin.

When the component has been fetched the punching device 24 will be reset. This means that again all picking points 23 will be empty and the carriage will be positioned in its left dead point which is the normal condition of the cassette.

According to the invention it will be possible to attain an extremely efficient cassette. Each tape can moreover be fed smoothly and with sufficient force to overcome reasonable resistance from rollers etc by means of an excenter driven carriage. Moreover, this can be attained by means of a very limited amount of mechanical details.

We claim:

1. A cassette magazine for a component mounting machine, comprising guiding members for a number of reels mounted on the magazine, said reels carrying components which are enclosed in a component carrier tape wound up on a reel, the reels being arranged in standing position in at least one row transverse to a feeding direction of the tape, said tape being fed to a component expelling and picking station, characterized in that the guiding members comprise a number of feeding wheels and drive segments corresponding to the number of tapes, said feeding wheels and drive segments being arranged for individual feeding of each of the tapes, and that said feeding wheels are rotatably mounted in a staionary position with respect to the magazine whereas the drive segments are supported on a movable carriage and can be brought into and out of engagement with the corresponding feeding wheel by means of electromagnetic members, and that the carriage is displaceable between two end positions by means of an electric motor, whereby the movement of the carriage is coordinated with energizing the electromagnetic members in such a way that a certain feeding wheel and the corresponding drive segment will be brought into engagement with one another for displacing the carriage from a first end position to a second end position and out of engagement with one another when returning the carriage from the second end position to the first end position.

2. A cassette magazine according to claim 1, characterized in that the electric motor drives the carriage via an excenter mechanism.

3. A cassette magazine according to claim 1, characterized in that the electric motor drives winding reels for a protective tape via a belt transmission, said protective tape being disposed over the component carrier tape.

4. A cassette magazine according to claim 1, characterized in that both the winding wheels and the package reels are supported by rollers.

5. A cassette magazine according to claim 1, characterized in that the feeding wheels and the drive segments are provided with cogs for engagement with one another during the feeding movement.

6. A cassette magazine according to claim 1, characterized in that the package reels are arranged in two parallel rows in which the inner distance between the reels in one row and the displacement between the rows are thus chosen that the carrier tape from the row behind passes between the reels in the row in front so that the center distance of the tapes at the component expelling and picking stations will be equal.

* * * * *